(12) United States Patent
Nomoto et al.

(10) Patent No.: US 7,863,745 B2
(45) Date of Patent: Jan. 4, 2011

(54) SEMICONDUCTOR DEVICE, MANUFACTURING METHOD OF THE SEMICONDUCTOR DEVICE, AND MOUNTING METHOD OF THE SEMICONDUCTOR DEVICE

(75) Inventors: Ryuji Nomoto, Kawasaki (JP); Hirohisa Matsuki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 225 days.

(21) Appl. No.: 11/595,854

(22) Filed: Nov. 13, 2006

(65) Prior Publication Data
US 2007/0284755 A1    Dec. 13, 2007

(30) Foreign Application Priority Data
Jun. 9, 2006    (JP) .............................. 2006-161128

(51) Int. Cl.
*H01L 23/48* (2006.01)
*H01L 23/52* (2006.01)
*H01L 29/40* (2006.01)

(52) U.S. Cl. ....................... 257/758; 257/642; 257/759; 257/760; 257/E23.142; 257/E23.145

(58) Field of Classification Search ................. 257/738, 257/759, 778, 781, 622, 637, 642, 643, 758, 257/760, E23.131, E23.142, E23.145; 438/114, 438/465
See application file for complete search history.

(56) References Cited

U.S. PATENT DOCUMENTS

| | | | |
|---|---|---|---|
| 6,617,655 B1 * | 9/2003 | Estacio et al. ................ | 257/401 |
| 6,952,048 B2 | 10/2005 | Terui | |
| 7,067,922 B2 | 6/2006 | Hasunuma et al. | |
| 7,285,867 B2 | 10/2007 | Matsuzaki et al. | |
| 7,489,032 B2 | 2/2009 | Jobetto | |
| 2004/0094841 A1 * | 5/2004 | Matsuzaki et al. ........... | 257/758 |
| 2004/0238926 A1 * | 12/2004 | Obinata ....................... | 257/678 |
| 2005/0035469 A1 * | 2/2005 | Yoshida et al. ............... | 257/786 |
| 2005/0161799 A1 * | 7/2005 | Jobetto ......................... | 257/690 |
| 2006/0220247 A1 * | 10/2006 | Hanaoka ...................... | 257/738 |

(Continued)

FOREIGN PATENT DOCUMENTS

JP    59-43557 A    3/1984

(Continued)

OTHER PUBLICATIONS

Official Letter in the Office Action issued Sep. 9, 2009 in the corresponding Taiwanese patent application No. 095141873.

(Continued)

*Primary Examiner*—Minh-Loan T Tran
*Assistant Examiner*—Leslie Pilar Cruz
(74) *Attorney, Agent, or Firm*—Westerman, Hattori, Daniels & Adrian, LLP

(57) ABSTRACT

A semiconductor device, including a semiconductor substrate where a plurality of functional elements is formed; and a multilayer interconnection layer provided over the semiconductor substrate, the multilayer interconnection layer including a wiring layer mutually connecting the plural functional elements and including an interlayer insulation layer, wherein a region where the wiring layer is formed is surrounded by a groove forming part, the groove forming part piercing the multilayer interconnection layer; and the groove forming part is filled with an organic insulation material.

7 Claims, 15 Drawing Sheets

U.S. PATENT DOCUMENTS

2008/0006910 A1 * 1/2008 Miyata et al. ............... 257/622

FOREIGN PATENT DOCUMENTS

| JP | 4-283950 A | 10/1992 |
| --- | --- | --- |
| JP | 2000-277463 A | 10/2000 |
| JP | 2002-289740 A | 10/2002 |
| JP | 2004-296905 A | 10/2004 |
| JP | 2004-349610 A | 12/2004 |
| JP | 2005-32782 A | 2/2005 |
| TW | 200414382 | 8/2004 |
| TW | 200527647 | 8/2006 |
| WO | WO 2006054606 A1 * | 5/2006 |

OTHER PUBLICATIONS

Japanese Office Action dated Oct. 19, 2010, issued in corresponding Japanese Patent Application No. 2006-161128 (With Partial Translation).

* cited by examiner

SEMICONDUCTOR DEVICE, MANUFACTURING METHOD OF THE SEMICONDUCTOR DEVICE, AND MOUNTING METHOD OF THE SEMICONDUCTOR DEVICE

BACKGROUND OF THE INVENTION

1. Field of the Invention

The present invention generally relates to semiconductor devices, manufacturing methods of the semiconductor devices, and mounting methods of the semiconductor devices, and more specifically, to a wafer level chip size package type semiconductor device, a manufacturing method of the semiconductor device, and a mounting method of the semiconductor device.

2. Description of the Related Art

Conventionally, packaging of a semiconductor device is implemented for every semiconductor chip. However, recently and continuously, a wafer level chip size package has been suggested as a high density mounting package that is contributing to making the size of an electronic device small or making the weight of the electronic device light.

In the above-mentioned wafer level chip size package, an assembly process is applied at a semiconductor wafer state and plural chips are resin sealed in a lump so that a single package is made as the end product.

According to such a wafer level chip size package, a bump pitch can be minute at substantially the same size as a bare chip and plural semiconductor chips are packaged in a lump. Hence, there is an advantage in that the manufacturing steps or materials can be simplified.

FIG. 1 through FIG. 3 are first through third cross-sectional views showing a manufacturing method of a related art wafer level chip size package type semiconductor device. In FIG. 1 through FIG. 3, for convenience of explanation, only two semiconductor elements (semiconductor devices) among a lot of semiconductor elements (semiconductor devices) on a single semiconductor substrate are shown as an example.

A so-called a wafer process is applied to manufacturing the wafer level chip size package semiconductor device. An active element such as a transistor or a passive element such as a capacitive element is formed on a main surface of a semiconductor substrate 1 made of silicon (Si). Furthermore, a multilayer interconnection layer 2 is formed on the main surface of the semiconductor substrate (See FIG. 1-(a)). The active element and the passive element are mutually connected via the multilayer interconnection layer 2 so that an electronic circuit having a desirable function can be formed.

While a detailed structure is not shown in FIG. 1, the multilayer interconnection layer 2 is formed by stacking plural wirings made of aluminum (Al) or copper (Cu) via interlayer insulation layers. A material having a low dielectric constant, namely so-called Low-K material, is used as a material of the interlayer insulation layer so that capacitance formed between wirings can be reduced and speed of transmission of an electronic signal can be high.

Plural outside connection electrode pads 3 made of aluminum (Al) are provided on the multilayer interconnection layer 2. An inorganic insulation payer (passivation layer) 4 made of, for example, silicon oxide ($SiO_2$) or silicon nitride (SiN) covers an external edge part of the electrode pad 3 and an upper surface of the multilayer interconnection layer 2.

Then, in order to protect a surface of the semiconductor element, an organic insulation layer 5 such as polyimide resin layer selectively covers an upper surface of the passivation layer 4 and an edge part of the passivation layer 4 on the electrode pad 3.

In addition, a wiring layer 6 made of copper (Cu) is selectively provided so as to extend from an exposed upper surface of the electrode pad 3 onto an upper surface of the organic insulation film 5.

An outside connection metal pole (post) 7 made of copper (Cu) is provided in the vicinity of an edge part of an extended part of the wiring layer 6 by a plating method (See FIG. 1-(b)).

Next, sealing resin 8 made of an epoxy group resin or the like is provided so that an upper surface of the sealing resin 8 reaches a position slightly lower than an upper end surface of the metal pole 7. Furthermore, a solder bump 9 having a substantially spherical shape, as an outside connection projection electrode, is provided on an upper part of the metal post 7 slightly projecting from an upper surface of the sealing resin 8 (see FIG. 2-(c)).

After that, for example, a dicing process using a dicing blade 10 is applied to the sealing resin 8, the multilayer interconnection layer 2, and the semiconductor substrate 1 so that pieces of the semiconductor devices 15 are obtained (See FIG. 2-(d)).

As a result of this, the semiconductor device shown in FIG. 3 is formed having a structure where the metal pole 7 is provided in the vicinity of the end part of the wiring layer 6 connected to the electrode pad 3 provided on the upper surface of the multilayer interconnection layer 2, the sealing resin 8 is provided on the organic insulation film 5 including the wiring layer 6, the upper surface of the metal pole 7 projects from the upper surface of the sealing resin 8, and the outside connection solder bump 9 is provided on the upper end surface of the projecting metal pole 7.

On the other hand, for example, Japanese Laid-Open Patent Application Publication No. 2000-277463 discloses a semiconductor device having a structure where an annular groove is formed around an active region of the semiconductor device and a semiconductor substrate is sealed with sealing resin with which the groove is filled so that moisture resistance of the semiconductor device is improved.

As discussed above, in the manufacturing process of the wafer level chip size package type semiconductor device 15, in a step shown in FIG. 2-(d), the multilayer interconnection layer 2 and the semiconductor substrate 1 are cut by the dicing blade 10 so that pieces of the semiconductor devices 15 are formed.

However, at the time of the dicing step, the multilayer interconnection layer including the interlayer insulation layer 2 made of an insulation material having a low dielectric constant may be broken. Because of this, in the environment of use of the semiconductor device 15, the breakage of the interlayer insulation layer 2 may further develop so that moisture may enter from a broken surface. This may cause degradation of properties of the semiconductor element so that reliability of the semiconductor device 15 may be decreased.

In order to solve the above-discussed problem, the technique disclosed in Japanese Laid-Open Patent Application Publication No. 2000-277463 may be applied to the semiconductor device 15.

As mentioned above, in the technique disclosed in Japanese Laid-Open Patent Application Publication No. 2000-277463, the annular groove formed around the active region of the semiconductor device is filled with the sealing resin. However, such a sealing resin does not have a sufficient adhesive force with the semiconductor substrate such as a silicon (Si) substrate. Because of this, even if a groove is formed in the insulation layer around a wiring region (circuit forming part) forming an electronic circuit together with the functional element formed on the semiconductor substrate and the groove is filled with the sealing resin, the sealing resin may be easily removed from an interface with the semiconductor substrate. Hence, it may not be possible to solve the above-discussed problem.

SUMMARY OF THE INVENTION

Accordingly, the present invention may provide a novel and useful semiconductor device, manufacturing method of the semiconductor device, and mounting method of the semiconductor device solving one or more of the problems discussed above.

More specifically, the embodiments of the present invention may provide a semiconductor device, such as a wafer level chip size package type semiconductor device, having a multilayer interconnection layer forming an electronic circuit by mutually connecting plural functional elements formed on a semiconductor substrate, the semiconductor device having a structure where moisture resistance of the multilayer interconnection layer can be improved; a manufacturing method of the semiconductor device; and a mounting method of the semiconductor device.

One aspect of the present invention may be to provide a semiconductor device, including a semiconductor substrate where a plurality of functional elements is formed; and a multilayer interconnection layer provided over the semiconductor substrate, the multilayer interconnection layer including a wiring layer mutually connecting the plural functional elements and including an interlayer insulation layer; wherein a region where the wiring layer is formed is surrounded by a groove forming part, the groove forming part piercing the multilayer interconnection layer; and the groove forming part is filled with an organic insulation material. The groove may have width equal to or greater than approximately 2 μm and equal to or smaller than approximately 50 μm. A plurality of the groove forming parts may be formed in the multilayer interconnection layer so as to surround the region where the wiring layer is formed; and each of the groove forming parts may be filled with the organic insulation material.

It may be also the aspect of the present invention to provide a mounting method of a semiconductor device, the semiconductor device including a semiconductor substrate where a plurality of functional elements is formed; and a multilayer interconnection layer provided over the semiconductor substrate, the multilayer interconnection layer including a wiring layer mutually connecting the plural functional elements and including an interlayer insulation layer; wherein a region where the wiring layer is formed is surrounded by a groove forming part, the groove forming part piercing the multilayer interconnection layer, the groove forming part is filled with an organic insulation material, resin is provided over the multilayer interconnection layer, and an outside connection projection electrode is formed on a surface of the resin, the mounting method of the semiconductor device including: supplying underfill resin to the multilayer interconnection layer exposed at a side surface of the semiconductor substrate when the semiconductor device is mounted on a circuit board, the underfill resin filling in between the circuit board and the semiconductor device.

It may be also the aspect of the present invention to provide a manufacturing method of a semiconductor device, including the steps of: forming a plurality of functional elements on a main surface of a semiconductor substrate; forming a multilayer interconnection layer on the main surface of the semiconductor substrate, the multilayer interconnection layer including a wiring layer mutually connecting the plural functional elements and including an interlayer insulation layer; forming a groove forming part surrounding a region where the wiring layer is formed, the groove forming part piercing the multilayer interconnection layer; and filling the groove forming part with an organic insulation material. The groove forming part may be formed by laser irradiation so as to pierce the multilayer interconnection layer.

According to an embodiment of the present invention, it is possible to provide a semiconductor device, such as a wafer level chip size package type semiconductor device, having a multilayer interconnection layer forming an electronic circuit by mutually connecting plural functional elements formed on a semiconductor substrate, the semiconductor device having a structure where moisture resistance of the multilayer interconnection layer can be improved; a manufacturing method of the semiconductor device; and a mounting method of the semiconductor device.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 4 through FIG. 15 of embodiments of the present invention.

First, a structure of a semiconductor device of an embodiment of the present invention is discussed, and then a manufacturing method and a mounting method of the semiconductor devices are discussed.

1. An Embodiment of a Semiconductor Device of the Present Invention

Figure 1:
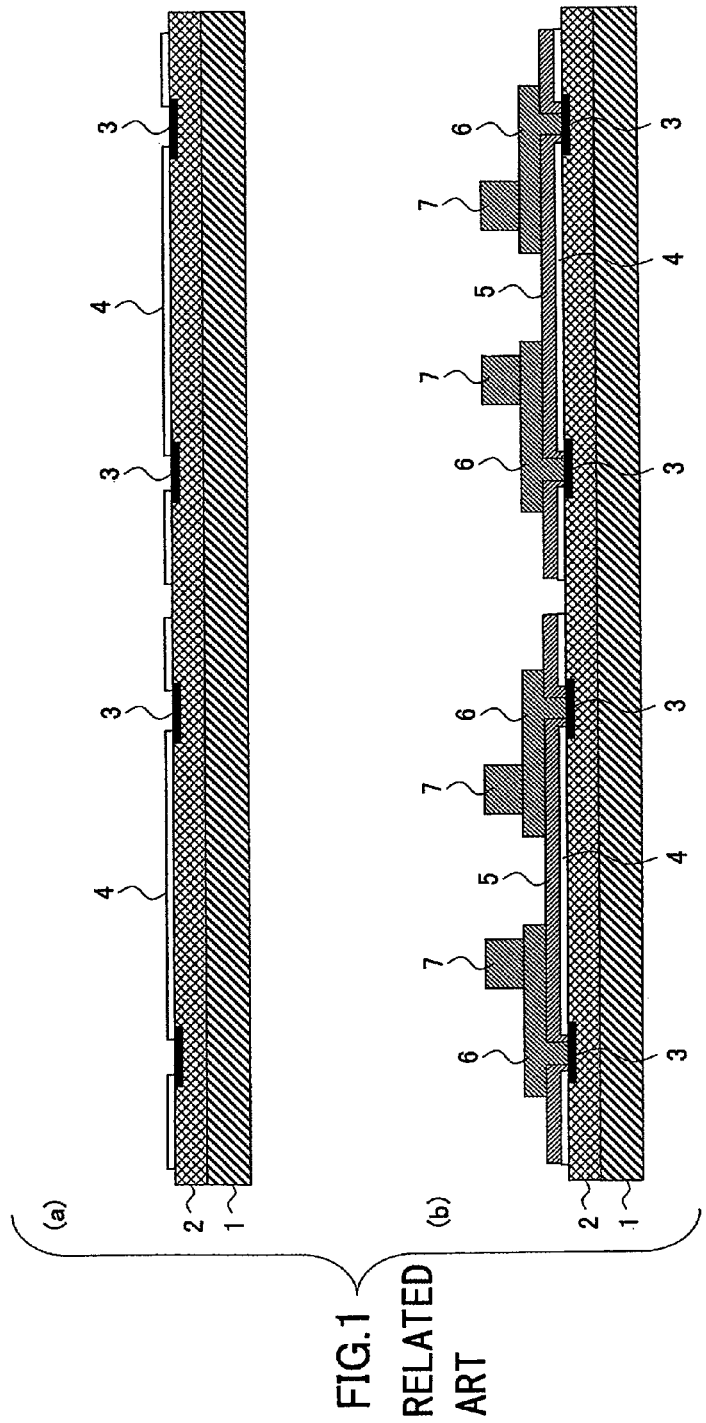
FIG. 1 is a first cross-sectional view showing a manufacturing method of a related art wafer level chip size package type semiconductor device.
Figure 2:
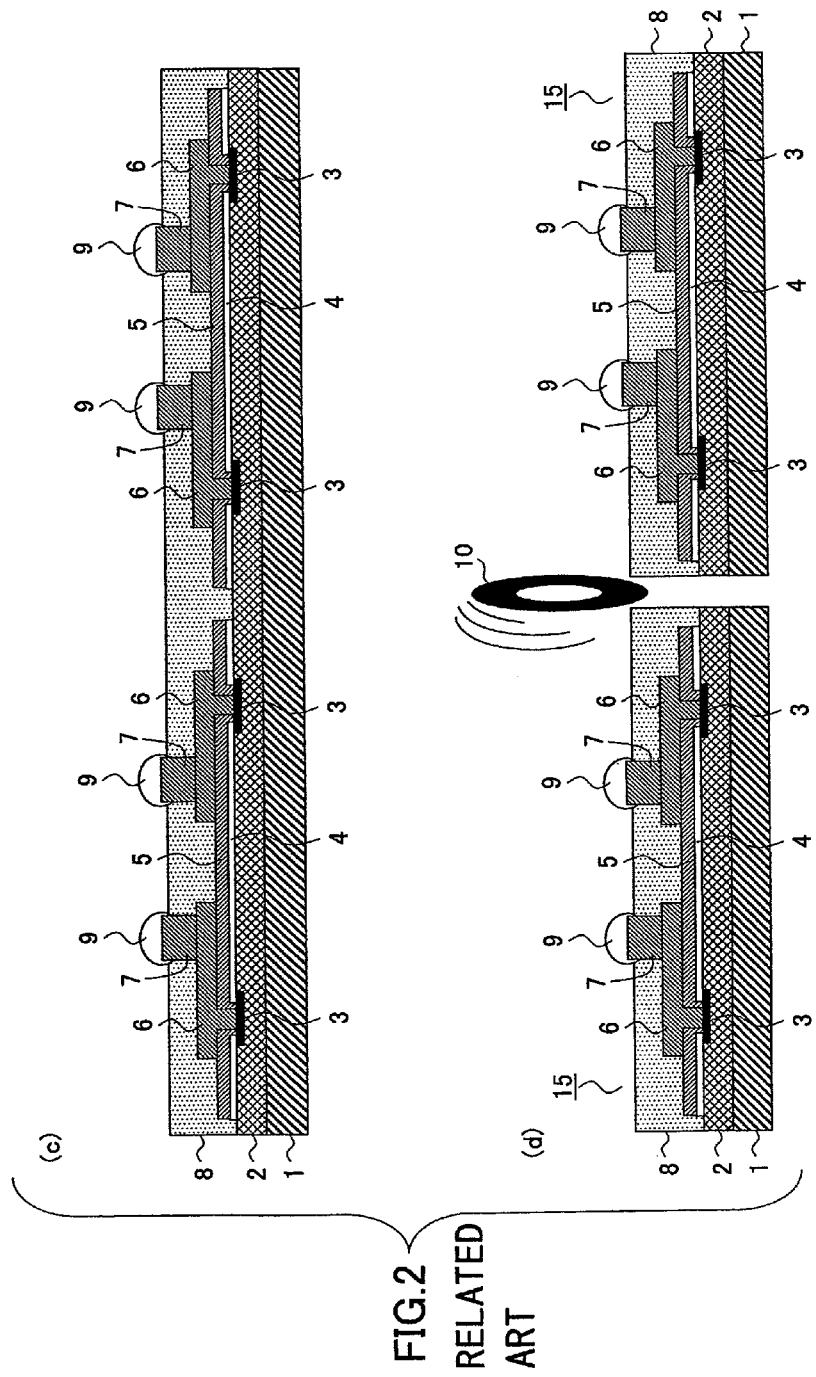
FIG. 2 is a second cross-sectional view showing the manufacturing method of the related art wafer level chip size package type semiconductor device.
Figure 3:
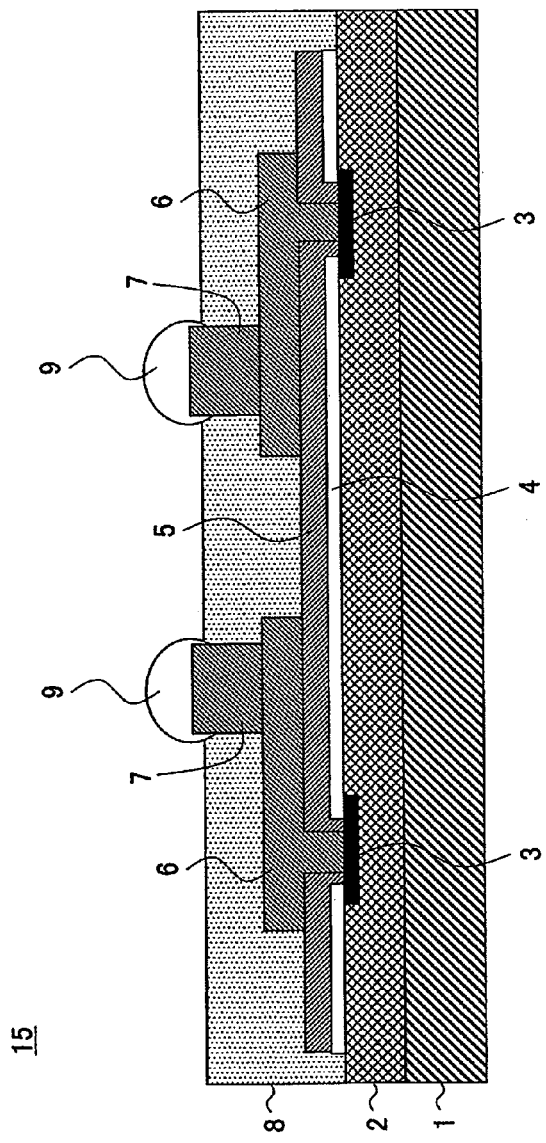
FIG. 3 is a third cross-sectional view showing the manufacturing method of the related art wafer level chip size package type semiconductor device.
Figure 4:
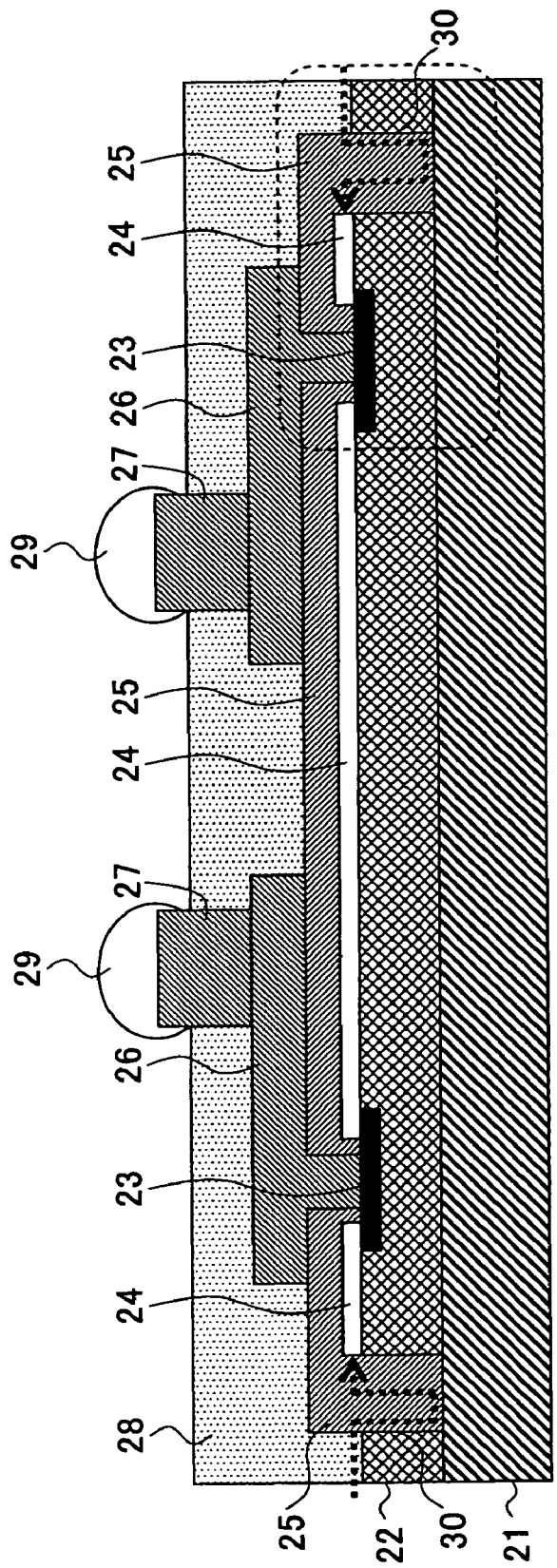
FIG. 4 is a cross-sectional view of a wafer level chip size package type semiconductor device of the present invention.
Figure 5:
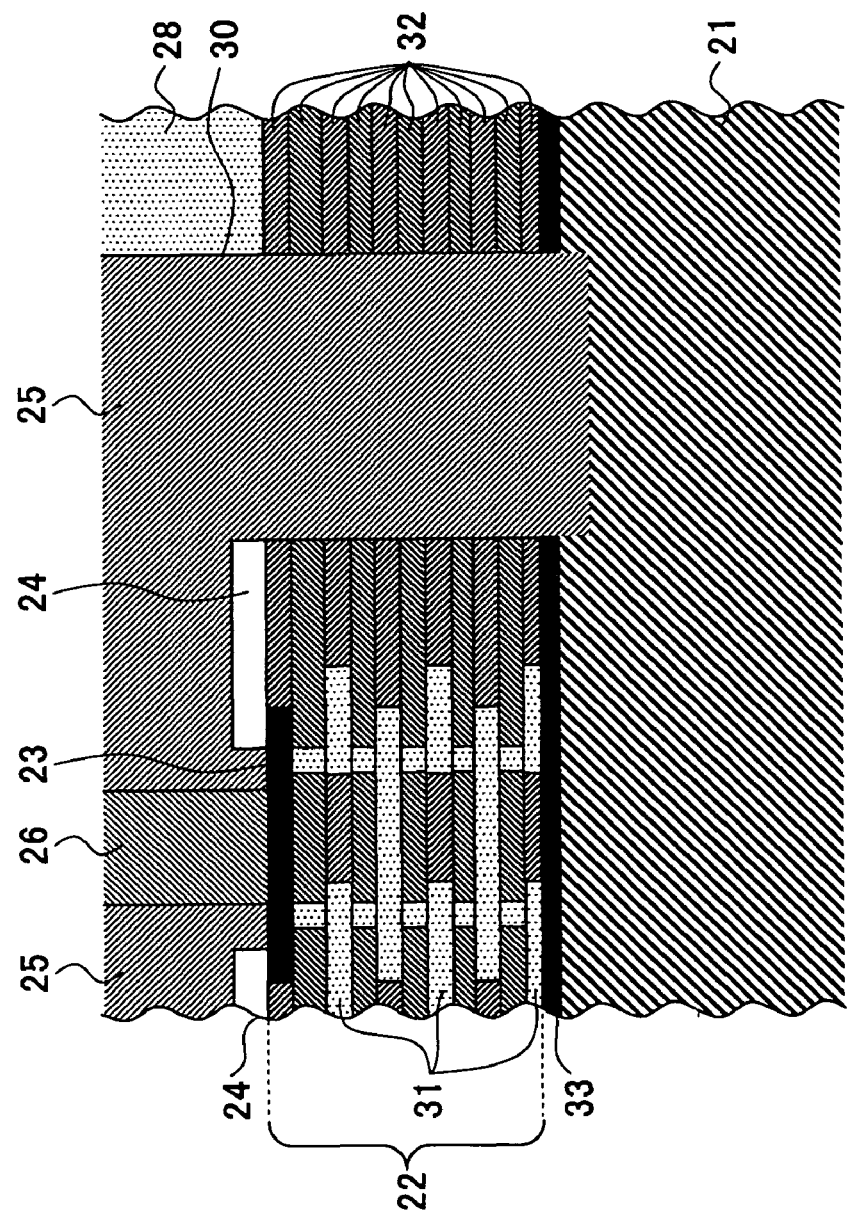
FIG. 5 is an expanded view of a part surrounded by a dotted line in FIG. 4.

FIG. 4 is a cross-sectional view of a wafer level chip size package type semiconductor device of the present invention. FIG. 5 is an expanded view of a part surrounded by a dotted line in FIG. 4.

Referring to FIG. 4, a semiconductor device 100 of the embodiment of the present invention is a wafer level chip size package type semiconductor device and includes a multilayer interconnection layer.

In other words, a so-called wafer process is applied to a semiconductor substrate 21 made of silicon (Si) for manufacturing the wafer level chip size package semiconductor device 100. An active element (not shown) such as a transistor or a passive element (not shown) such as a capacitive element is formed on a main surface of a semiconductor substrate 21. Furthermore, a multilayer interconnection layer 22 is formed on the main surface of the semiconductor substrate 21 via an insulation layer such as a silicon oxide (SiO$_2$) layer 33 (See FIG. 5).

Such a multilayer interconnection layer 22 is formed, as shown in FIG. 5, by stacking multiple wirings 31 made of copper (Cu) via interlayer insulation layers 32. The wiring 31 has a thickness of, for example, approximately 0.5 μm. An upper wiring 31 and a lower wiring 31 are connected by an interlayer connection part.

A material having a low dielectric constant, namely a so-called Low-K material, such as SiOC, is used as a material of the interlayer insulation layer 32 so that capacitance formed between wirings can be reduced and speed of transmission of an electronic signal can be high.

Functional elements such as the active element and the passive element formed on the semiconductor substrate 21 are mutually connected via the multilayer interconnection layer 22 so that an electronic circuit having a desirable function can be formed.

Plural electrode pads 23 made of aluminum (Al) are provided on an upper part of the multilayer interconnection layer 22 so as to be connected to the wiring 31 forming the multilayer interconnection layer 22.

A passivation layer 4 made of, for example, silicon oxide (SiO$_2$) or silicon nitride (SiN) is provided on the multilayer interconnection layer 22 so that a center part of the electrode pad 23 is opened (exposed).

In order to protect a surface of a semiconductor element, an organic insulation layer 25 covers an upper surface of the passivation layer 24 and an edge part of the passivation layer 24 on the electrode pad 3.

The organic insulation film 25 is made of an organic insulation material selected from a group consisting of polyimide, benzocyclobutene, phenol resin, and polybenzoxazole. The thickness of the organic insulation film 25 is equal to or greater than approximately 2 μm so that no damage is caused during a resin sealing process.

A continuous groove forming part 30 is provided at a region of the multilayer interconnection layer 22 other than a wiring region forming an electronic circuit with the functional element, namely a region outside a region where the wiring 31 connected to the electrode pad 23 is formed so as to surround the wiring region.

The groove forming part 30 pierces a silicon oxide layer 33 provided between the semiconductor substrate 21 and the multilayer interconnection layer 22 and reaches an upper surface of the semiconductor substrate 21. In other words, the groove forming part 30 pierces stacked insulation layers forming the multilayer interconnection layer 22.

The groove forming part 30 is provided in a region where the wiring 31 is not provided, namely a region where only plural interlayer insulation layers are provided, of the multilayer interconnection layer 22.

In addition, the inside of the groove forming part 30 is filled with the organic insulation material forming the organic insulation film 25.

Accordingly, the organic insulation film 25 covers an upper surface of a wiring region of the multilayer interconnection layer 22 forming the electronic circuit with the active element or passive element and a surrounding side surface part of the multilayer interconnection layer 22 including the wiring region.

A multilayer interconnection structure includes a so-called moisture resistance ring (not shown) positioned around the wiring region forming the electronic circuit with the functional element outside of the electrode pad 23, and is formed by stacking belt shaped patterns made of materials of the wiring layers. This moisture resistance ring is formed at the same time as forming the multilayer interconnection layer 22.

The groove forming part 30 is provided so as to be positioned outside of the moisture resistance ring, namely the external circumferential edge of the semiconductor element (semiconductor chip).

On the other hand, a wiring layer 26 made of copper (Cu) is provided so as to be extended from a surface of the exposed electrode pad 23 to an upper surface of the organic insulation film 25.

A metal pole (post) 27 for contacting made of copper (Cu) is provided in the vicinity of the end part of the wiring layer 26 by, for example, a selective plating method. A covering layer is provided on a surface of the metal pole 27. The covering layer is made of, from the surface of the metal pole 27, Nickel (Ni)/gold (Au) or Nickel (Ni)/palladium (Pd)/gold (Au).

In addition, an exposed surface of the multilayer interconnection layer 22 where the organic insulation film 25 is not provided, the surface of the organic insulation film 25, the surface of the wiring layer 26, and the side surface of the metal pole 27 are covered with a sealing resin 28. The sealing resin 28 has a height (thickness) so that the upper surface of the sealing resin 28 reaches a position slightly lower than the upper surface of the metal pole 27.

The sealing resin 28 may be selected from a group consisting of polyimide, benzocyclobutene, polybenzoxazole, phenol resin, bismaleimide-triazine resin, and epoxy resin.

In addition, outside connection projection electrodes 29 having substantially spherical shapes are provided on upper end parts of plural metal poles 27 slightly projecting from the upper surface of the sealing resin 28. The outside connection projection electrode 29 are made of, for example, tin (Sn)—silver (Ag) solder or tin (Sn)—silver (Ag) solder including copper (Cu).

As discussed above, in the semiconductor device 100 of the embodiment of the present invention, the groove forming part 30 is formed in the multilayer interconnection layer 22 so as to surround the wiring region forming the electronic circuit with the functional element formed on the semiconductor substrate and pierce the multilayer interconnection layer 22. The groove forming part 30 is filled with the organic insulation material forming the organic insulation film 25.

Accordingly, even if a crack is generated in the multilayer interconnection layer 22 at an end surface of the package at the time of dicing the multilayer interconnection layer 22, the organic insulation film 25 provided in the groove forming part 30 works as a dam so that the crack is prevented from being extended. As a result of this, it is possible to prevent the wiring region forming the electronic circuit from being destroyed at the multilayer interconnection layer 22.

Furthermore, the organic insulation film 25 is made of a material softer than the sealing resin 28. Hence, it is possible to effectively absorb or ease thermal stress or mechanical stress from the outside under an environment of use or in an environmental test of the semiconductor device 100. Thus, it is possible to improve reliability of the semiconductor device 100.

In addition, as discussed above, the groove forming part 30 is formed in the multilayer interconnection layer 22 and the groove forming part 30 is filled with the organic insulation material forming the organic insulation film 25. Hence, the organic insulation film 25 comes in contact with the multilayer interconnection layer 22 with a large contact area.

As a result of this, even if moisture enters from an interface of the multilayer interconnection layer 22 and the sealing resin 28, the moisture enters along an internal wall of the groove forming part 30. The length of the path as shown by a dotted arrow in FIG. 4, namely the length of the path along the internal surface, is long.

Therefore, entering of the moisture to the functional element of the semiconductor device 100 is effectively prevented so that the semiconductor device 100 has a high reliability.

The groove forming part 30 in the multilayer interconnection layer 22 may be formed, for example, by using a laser. In the case where the groove forming part 30 is formed in the multilayer interconnection layer 22 by using the laser, the width of the groove forming part 30 may be approximately 2 μm. While the width of the groove forming part 30 depends on an output of the laser, the width may be approximately 50 μm as a maximum.

As discussed above, in the example shown in FIG. 4, a single groove forming part 30 is formed in the multilayer interconnection layer 22 in the vicinity of the end surface of the package, so as to surround the wiring region forming the electronic circuit with the functional element formed on the semiconductor substrate and pierce the multilayer interconnection layer 22. The groove forming part 30 is filled with the organic insulation film 25.

However, the present invention is not limited to the structure shown in FIG. 4. The present invention may be applied to a structure shown in FIG. 6.

Figure 6:
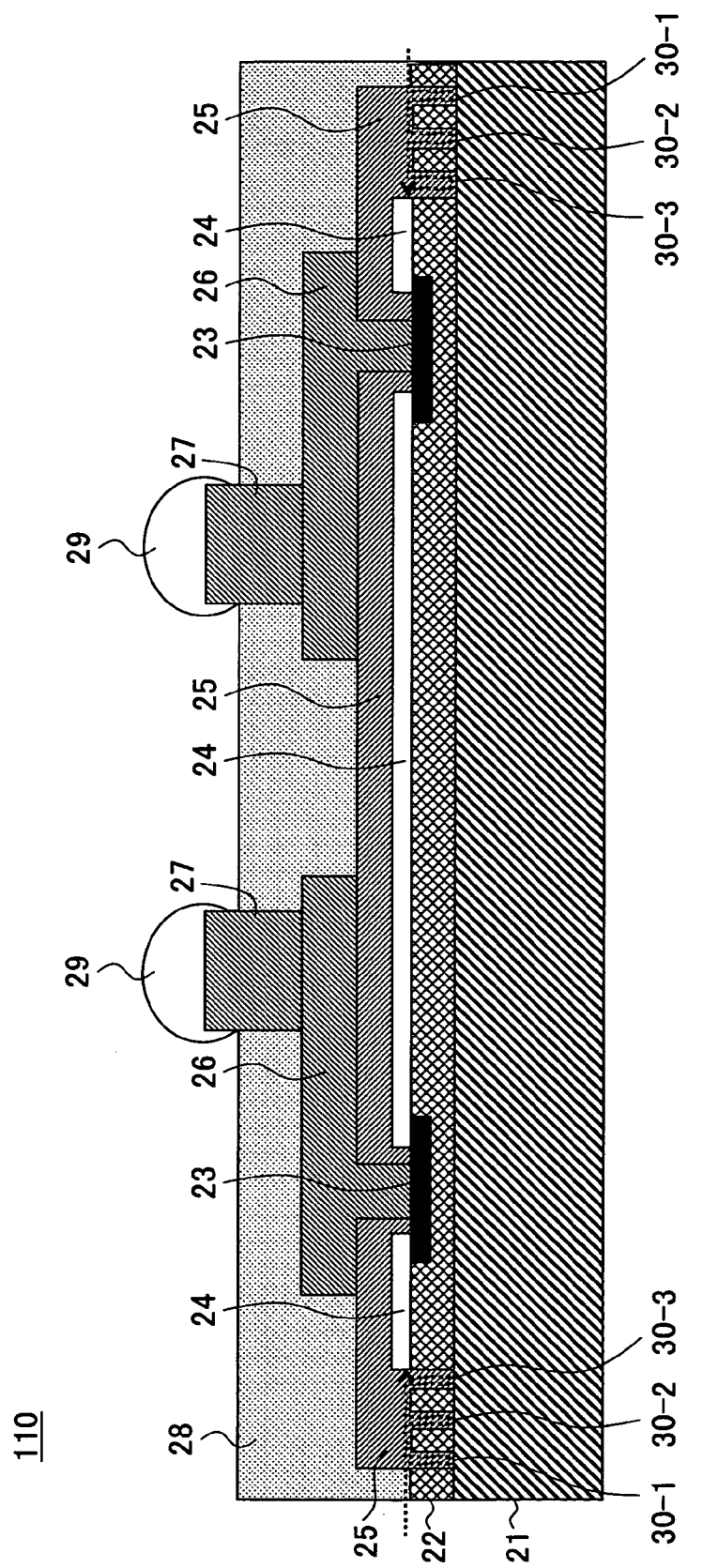
FIG. 6 is a cross-sectional view of a semiconductor device a first modified example of the semiconductor device shown in FIG. 4.

Here, FIG. 6 is a cross-sectional view of a semiconductor device 110 of a first modified example of the semiconductor device 100 shown in FIG. 4. In FIG. 6, parts that are the same as the parts shown in FIG. 4 are given the same reference numerals, and explanation thereof is omitted.

In the semiconductor device 110, plural groove forming parts 30 are formed in the multilayer interconnection layer 22, so as to surround the wiring region forming the electronic circuit with the functional element formed on the semiconductor substrate and pierce the multilayer interconnection layer 22. Each of the groove forming parts 30 is filled with the organic insulation material forming the organic insulation film 25.

In other words, in the semiconductor device 110, three groove forming parts 30-1, 30-2, and 30-3 are formed in the multilayer interconnection layer 22, so as to surround the wiring region forming the electronic circuit with the functional element formed on the semiconductor substrate and pierce the multilayer interconnection layer 22. Each of the groove forming parts 30-1, 30-2, and 30-3 is filled with the organic insulation material forming the organic insulation film 25.

Accordingly, even if a crack is generated in the multilayer interconnection layer 22 at an end surface of the package at the time of dicing the multilayer interconnection layer 22, the organic insulation films 25 provided in the groove forming parts 30-1, 30-2, and 30-3 work as dams so that the crack is prevented from being extended. As a result of this, the wiring region forming the electronic circuit of the multilayer interconnection layer 22 can be effectively protected.

Furthermore, the organic insulation films 25 provided in the groove forming parts 30-1 through 30-3 absorb or ease thermal stress or mechanical stress from the outside.

Thus, in this modified example, three groove forming parts 30-1, 30-2, and 30-3 are formed in the multilayer interconnection layer 22, so as to surround the wiring region forming the electronic circuit with the functional element formed on the semiconductor substrate and pierce the multilayer interconnection layer 22. Each of the groove forming parts 30-1, 30-2, and 30-3 is filled with the organic insulation material forming the organic insulation film 25.

Accordingly, even if moisture enters from an interface of the multilayer interconnection layer 22 and the sealing resin 28, the moisture enters along internal walls of the groove forming parts 30-1, 30-2 and 30-3. The length of the path as shown by a dotted arrow in FIG. 6 is longer than that of the semiconductor device 100. That is, by this structure, reliability of the semiconductor device 130 can be further developed.

In the examples shown in FIG. 4 and FIG. 6, the metal pole (post) 27 is provided in the vicinity of the end part of the wiring layer 26. The sealing resin 28 is provided so that the upper surface of the sealing resin 28 reaches a position slightly lower than the upper surface of the metal pole 27. A spherical shaped outside connection projection electrode 29 is provided on the upper part of the metal pole 27 slightly projecting from the upper surface of the sealing resin 28.

However, the present invention is not limited to such an outside connection terminal structure. The present invention may be applied to wafer level chip size package type semiconductor devices having other outside connection terminal structures.

Figure 7:
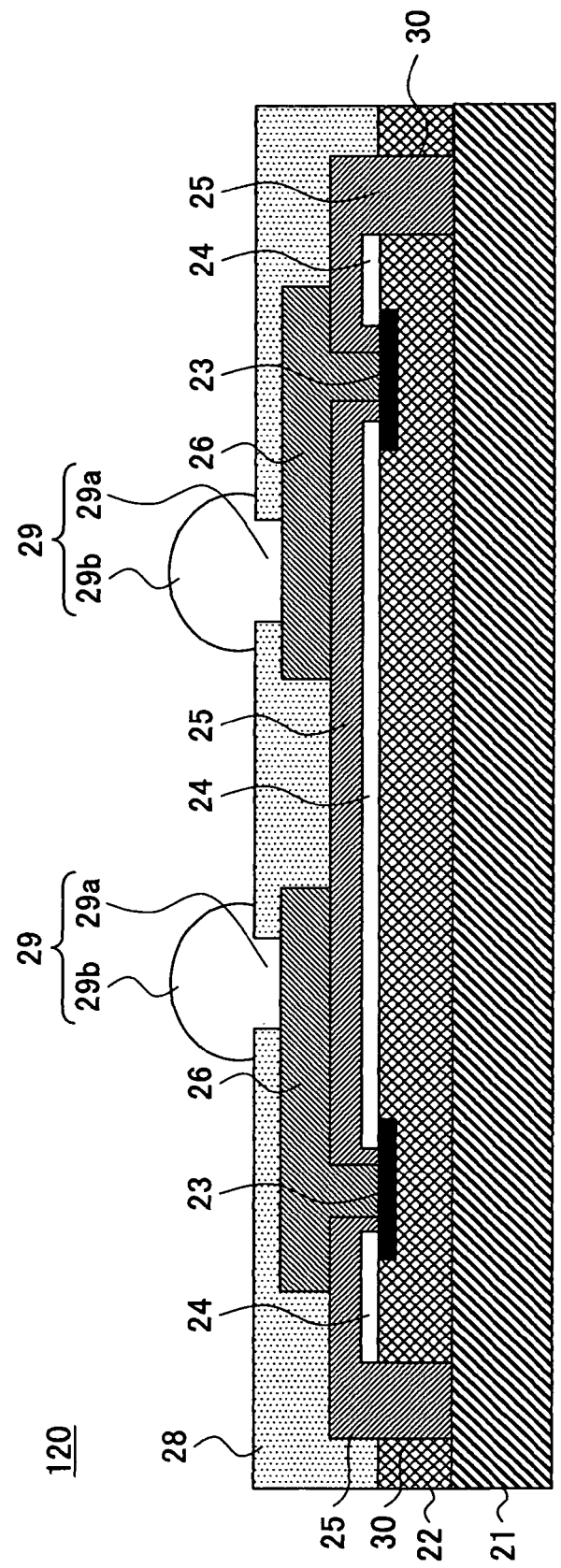
FIG. 7 is a cross-sectional view of a semiconductor device a second modified example of the semiconductor device shown in FIG. 4.
Figure 8:
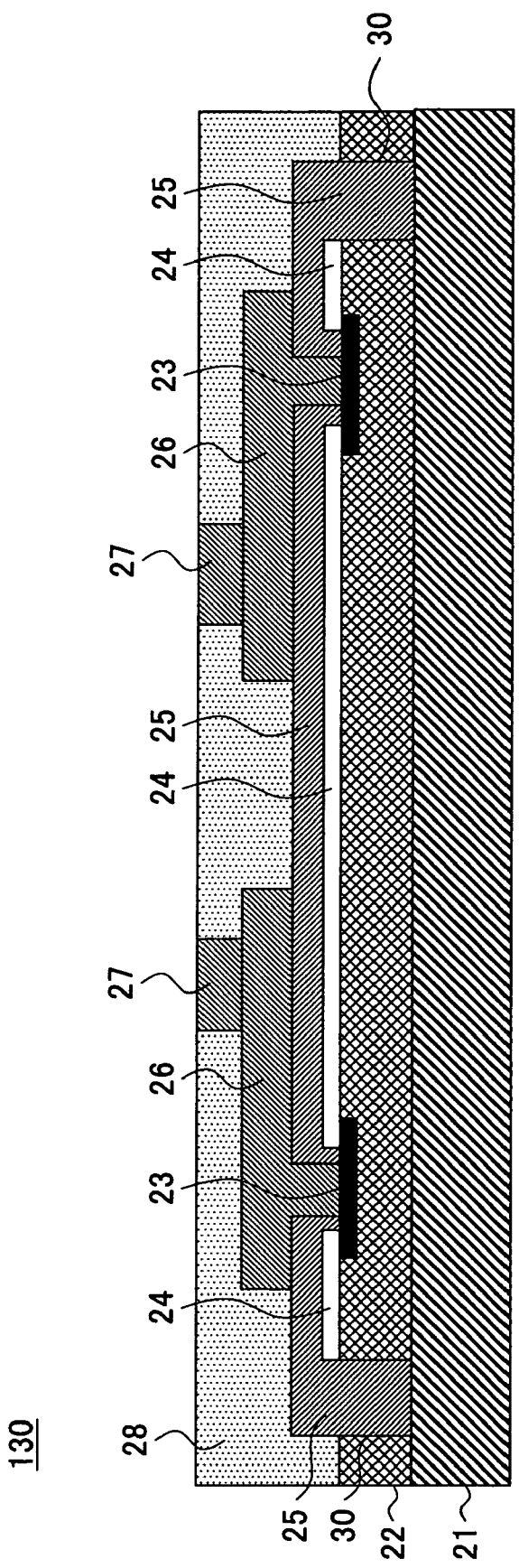
FIG. 8 is a cross-sectional view of a semiconductor device a third modified example of the semiconductor device shown in FIG. 4.

In other words, as the outside connection terminal structure, for example, a structure shown in FIG. 7 or FIG. 8 can be applied.

Here, FIG. 7 is a cross-sectional view of a semiconductor device 120 of a second modified example of the semiconductor device 100 shown in FIG. 4. FIG. 8 is a cross-sectional view of a semiconductor device 130 of a third modified example of the semiconductor device 100 shown in FIG. 4. In FIG. 7 and FIG. 8, parts that are the same as the parts shown in FIG. 4 or FIG. 6 are given the same reference numerals, and explanation thereof is omitted.

In the semiconductor device 120 shown in FIG. 7, the groove forming part 30 is formed in the multilayer interconnection layer 22 so as to surround the wiring region forming the electronic circuit with the functional element formed on the semiconductor substrate and pierce the multilayer interconnection layer 22. The groove forming part 30 is filled with the organic insulation material forming the organic insulation film 25.

In the vicinity of the end part of the wiring layer 26, instead of the metal pole 27 of the semiconductor device 100, an outside connection projection electrode 29 made of solder is provided.

In other words, the upper surface of the multilayer interconnection layer 22 which is not covered with the organic insulation film 25, the surface of the organic insulation film 25, the exposed surface of the wiring layer 26, and the side surface of the outside connection projection electrode 29 are covered with the sealing resin 28. While an end part 29a of the outside connection projection electrode 29 comes in contact with the wiring layer 26, a head end part 29b of the outside connection projection electrode 29 projects from the surface of the sealing resin 28.

The same effect as that of the semiconductor device 100 can be achieved by this example.

In the semiconductor device 120 as well as the semiconductor device 110, plural groove forming parts may be formed in the multilayer interconnection layer 22, so as to surround the wiring region forming the electronic circuit with the functional element formed on the semiconductor substrate and pierce the multilayer interconnection layer 22. Each of the groove forming parts may be filled with the organic insulation material forming the organic insulation film 25.

A semiconductor device 130 shown in FIG. 8 is a wafer level chip size package type semiconductor device wherein an outside connection terminal structure is a so-called LGA (Land Grid Array) structure.

In the semiconductor device 130, the groove forming part is formed in the multilayer interconnection layer 22, so as to surround the wiring region forming the electronic circuit with the functional element formed on the semiconductor substrate and pierce the multilayer interconnection layer 22. The groove forming part is filled with the organic insulation material forming the organic insulation film 25.

An outside connection pole shaped electrode 27 is provided in the vicinity of the end part of the wiring layer 26. The outside connection pole shaped electrode 27 does not project from the upper surface of the sealing resin 28.

The same effect as that of the semiconductor device 100 can be achieved by this example.

In the semiconductor device 130 as well as the semiconductor device 110, plural groove forming parts may be formed in the multilayer interconnection layer 22, so as to surround the wiring region forming the electronic circuit with the functional element formed on the semiconductor substrate and pierce the multilayer interconnection layer 22. Each of the groove forming parts may be filled with the organic insulation material forming the organic insulation film 25.

The semiconductor devices 100, 110, 120, and 130 are mounted on a printed wiring board by a normal flip chip connection method (face down connection method).

At this time, it is possible to tighten connection between the semiconductor devices 100, 110, 120, or 130 and the printed wiring board by supplying a so-called underfill material between the semiconductor devices 100, 110, 120, or 130 and the printed wiring board and by curing the underfill material.

2. An Embodiment of a Manufacturing Method of the Semiconductor Device of the Present Invention Referring to FIG. 9 through FIG. 15, an embodiment of a manufacturing method of the semiconductor device 100 is discussed.

Figure 9:
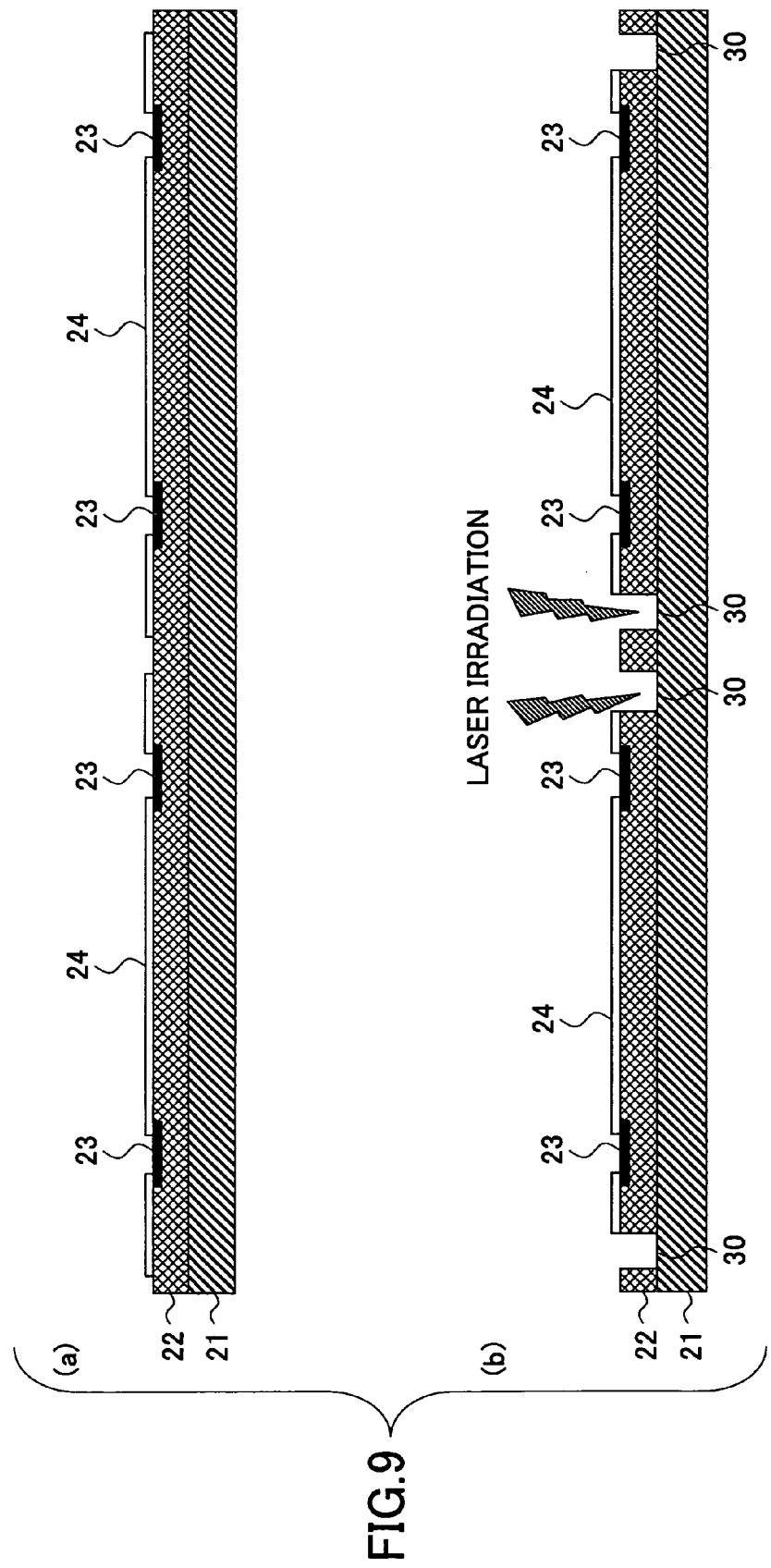
FIG. 9 is a first cross-sectional view showing a manufacturing method of the semiconductor device shown in FIG. 4.

A so-called wafer process is applied to a semiconductor substrate 21 made of silicon (Si), so that a multilayer interconnection layer 22 is formed on the main surface of the semiconductor substrate 21 where an active element or a passive element is formed, via an insulation layer such as a silicon oxide ($SiO_2$) layer 33 (See FIG. 9-(a)).

Such a multilayer interconnection layer 22 is formed, as shown in FIG. 5, by stacking multiple wirings 31 made of copper (Cu) via interlayer insulation layers 32. The wiring 31 has a thickness of, for example, approximately 0.5 μm. As a material of the interlayer insulation layer 32, a material having a low dielectric constant, namely a so-called Low-K material, is used.

Plural electrode pads 23 made of aluminum (Al) are selectively provided on the upper part of the multilayer interconnection layer 22 so as to be connected to the wiring 31 (See FIG. 5) forming the multilayer interconnection layer 22.

In addition, the passivation layer 24 made of, for example, silicon oxide ($SiO_2$) or silicon nitride (SiN) is provided on the multilayer interconnection layer 22 so that a center part of the electrode pad 23 and a scribe planning region is opened (exposed).

Next, the groove forming part 30 is formed in a region outside of the wiring region forming the electronic circuit with the functional element formed on the semiconductor substrate 21, that is, in a region outside of the region where the wiring 31 connected to the electrode pad 23 is provided, of the multilayer interconnection layer 22, so as to surround the wiring region forming the electronic circuit. See FIG. 9-(b).

A laser irradiation method is used for forming the groove forming part 30. In the laser irradiation, there is a lower probability of causing mechanical damage to the multilayer interconnection layer 22 as compared to a dicing method. There is no limitation in kinds of lasers. For example, a YAG laser can be used.

A portion where laser light is irradiated in the multilayer interconnection layer 22 is made molten and removed so that the groove forming part 30 can be formed. The groove forming part 30 pierces the multilayer interconnection layer 22.

The minimum width of the groove forming part 30 is determined by a minimum value of irradiation of the laser light and can be, for example, approximately 2 μm. In addition, the maximum width of the groove forming part 30 can be approximately 50 μm by changing the output of the laser light.

The groove forming part 30 pierces the silicon oxide layer 32 (See FIG. 5) provided between the semiconductor substrate 21 and the multilayer interconnection layer 22 so as to reach the upper surface of the semiconductor substrate 21. Accordingly, the depth of the groove forming part is determined by the thickness of the multilayer interconnection layer 22 and can be equal to or greater than approximately 0.1 μm.

In a case where plural groove forming parts 30-1 through 30-3 are formed in a region of the multilayer interconnection layer 22 outside of the wiring region forming the electronic circuit with the functional element formed on the semiconductor substrate 21 so as to surround the wiring region forming the electronic circuit, such as the semiconductor device 110 shown in FIG. 6, the position of the laser irradiation is properly changed in a horizontal direction, namely a direction parallel with the surface of the semiconductor substrate, and then the laser light is irradiated.

As a forming method of the groove forming part 30, not only the selective irradiation of the laser light but also a chemical method such as wet etching can be applied.

Next, the organic insulation material is selectively provided so as to cover the upper surface of the passivation layer 24 and the edge part of the passivation layer 24 on the electrode pad 23. See FIG. 10-(c).

The organic insulation material covers the upper surface of the passivation layer 24 and the end part of the passivation layer on the electrode pad 23, and fills the groove forming part 30. A thermal process at a designated curing temperature is applied so that the organic insulation material is cured. As a result of this, the organic insulation film 25 is formed.

As the organic insulation material, for example, benzocyclobutene, phenol resin, or polybenzoxazole can be used. In this case, a thermal process at a temperature equal to or lower than 350° C. is applied for curing. On the other hand, in a case where polyimide is used as the organic insulation material, a thermal process at a temperature equal to or lower than 400° C. is applied for curing.

Figure 10:
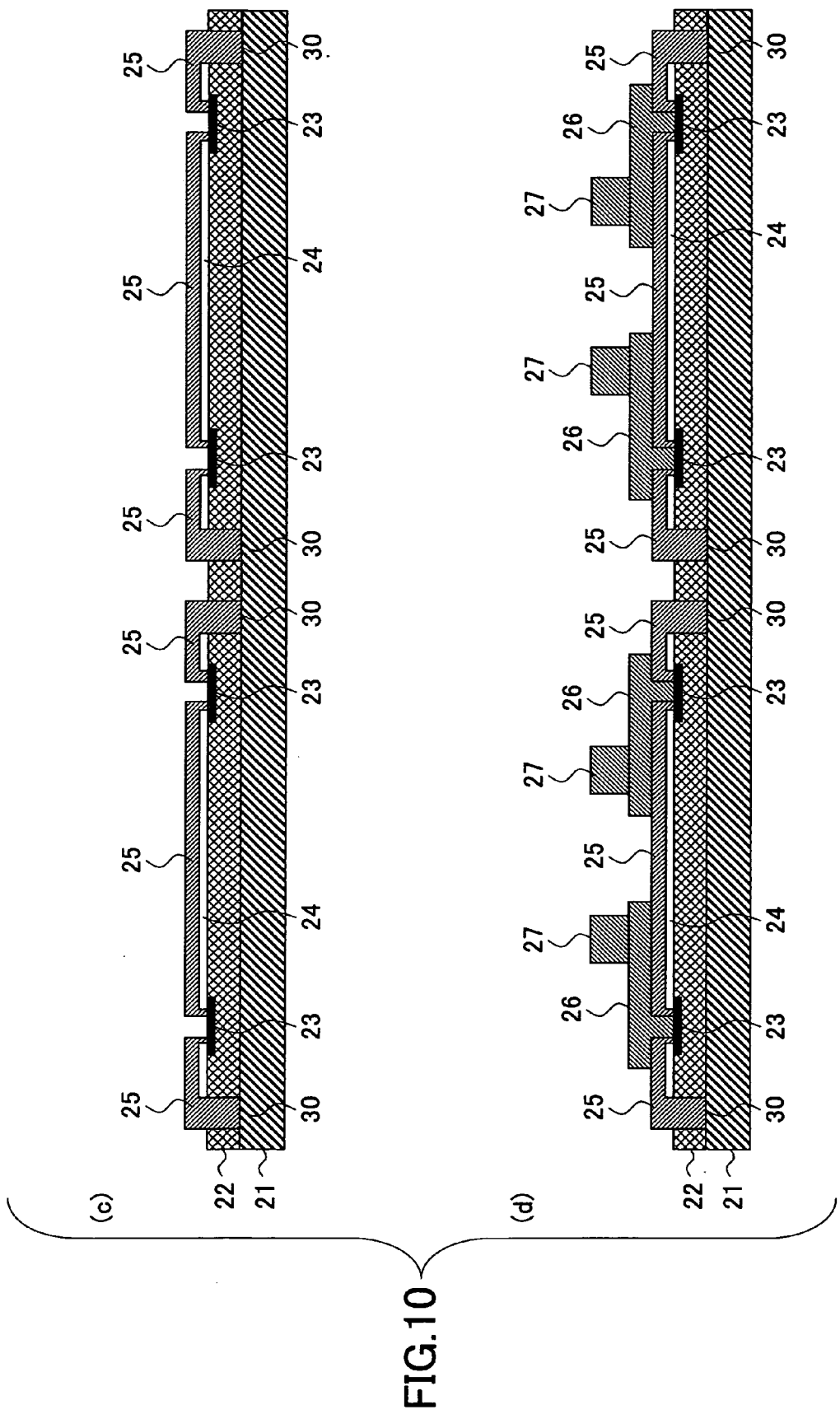
FIG. 10 is a second cross-sectional view showing the manufacturing method of the semiconductor device shown in FIG. 4.
Figure 11:
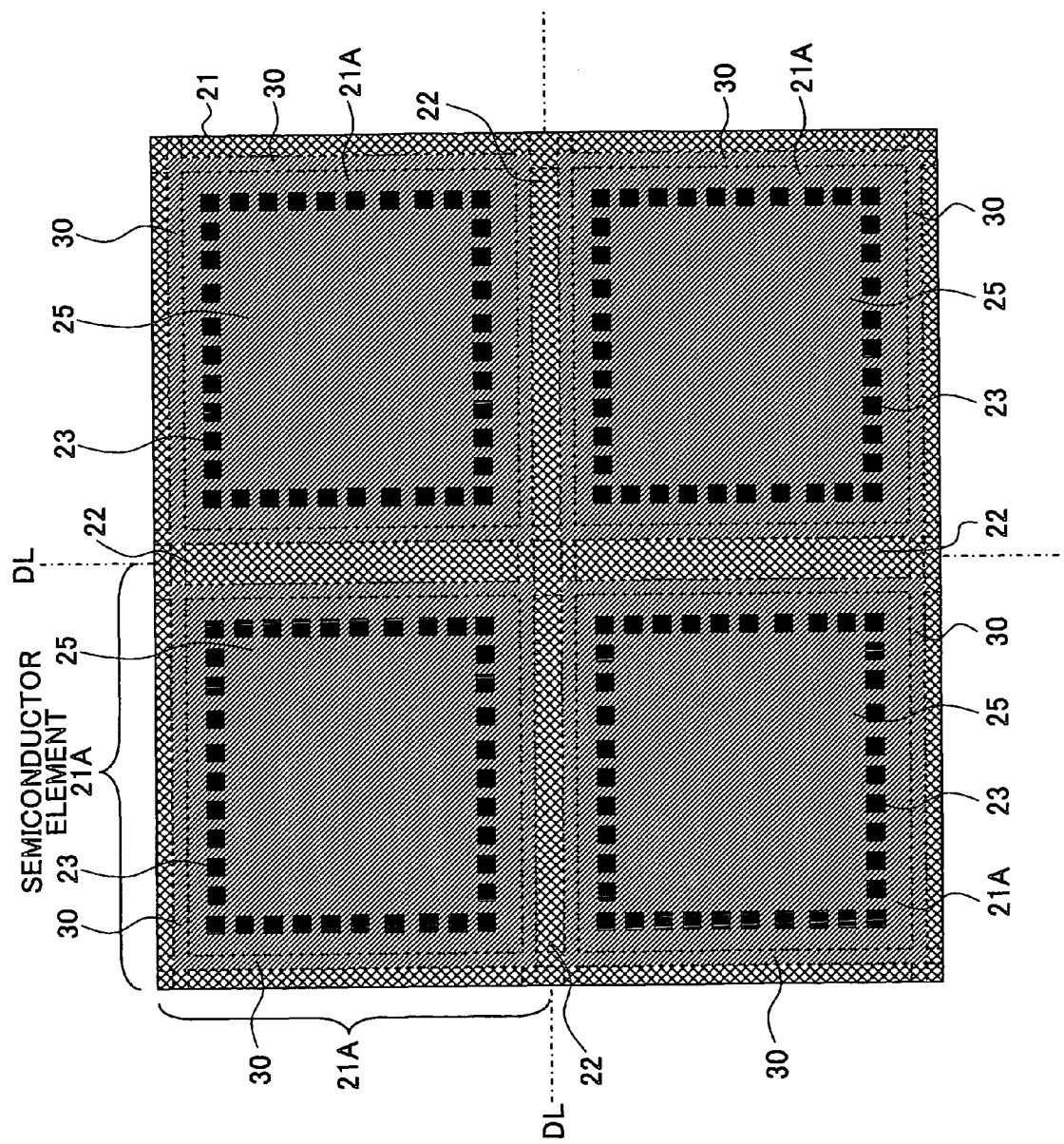
FIG. 11 is a plan view of the semiconductor device in the state shown in FIG. 10-(c)
Figure 12:
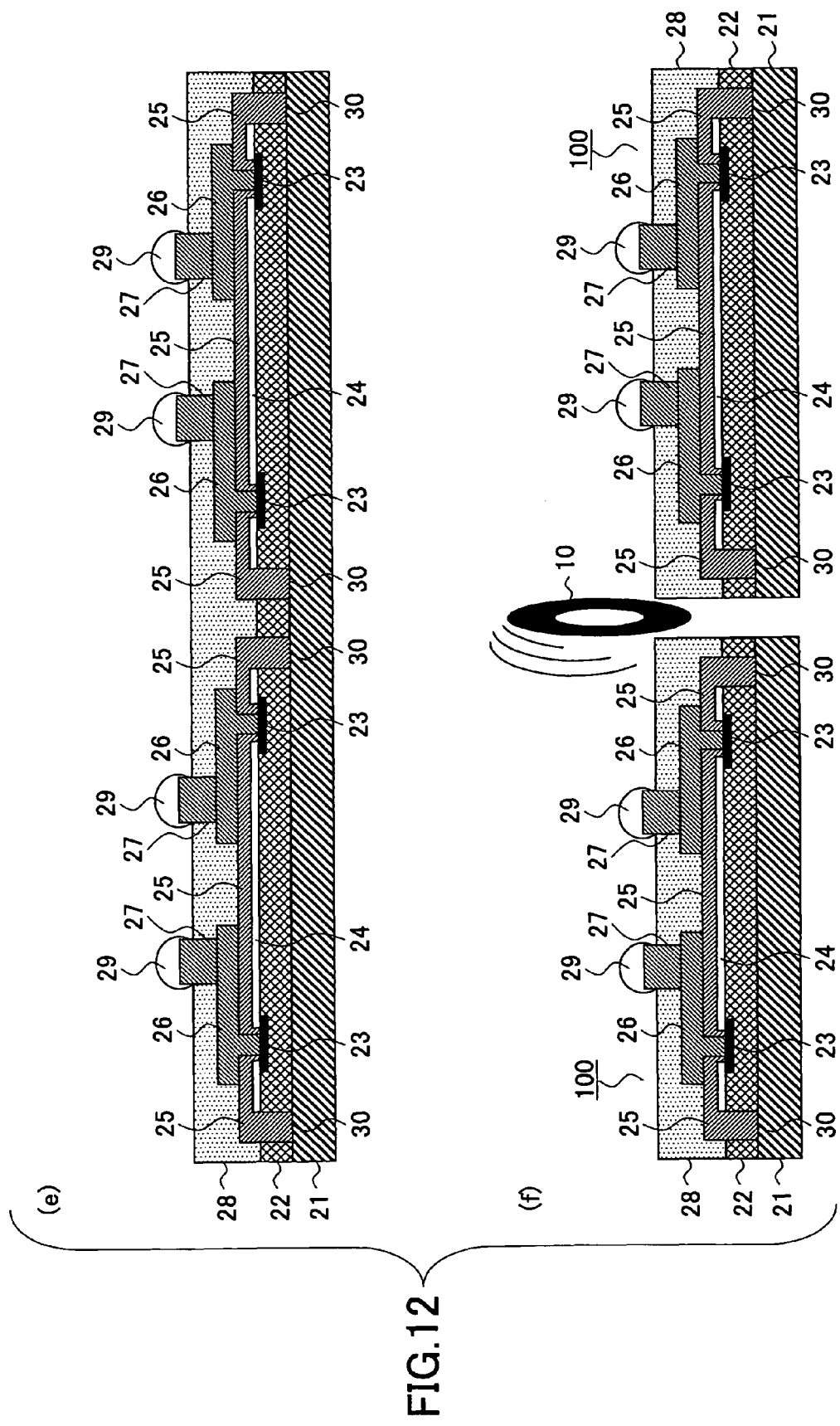
FIG. 12 is a third cross-sectional view showing the manufacturing method of the semiconductor device shown in FIG. 4.

FIG. 11 is a plan view of the semiconductor device in the state shown in FIG. 10-(c).

In FIG. 11, only for semiconductor elements among a lot of semiconductor elements formed on the semiconductor substrate 21 are shown. A dicing process is applied to these four semiconductor elements along dicing lines DL provided along the circumference by a process discussed below so as to make four pieces.

In the individual semiconductor element 21A, the groove-forming part 30 which runs in a continuous rectangular shape is formed in a region of the multilayer interconnection layer 22 outside of the wiring region forming the electronic circuit with the functional element formed on the semiconductor substrate 21, that is, in a region outside of the region where the wiring 31 (see FIG. 5) connected to the electrode pad 23 is provided, and in a region outside of the moisture resistance ring (not shown), so as to surround the wiring region forming the electronic circuit.

The organic insulation film 25 covers the upper surface of the multilayer interconnection layer 22 including the wiring region forming the electronic circuit and fills the groove forming part 30.

While not shown in FIG. 11, the center part of the electrode pad 23 is not covered with the organic insulation film 25 so that the surface of the electrode pad 23 is exposed. See FIG. 10-(c).

After the step shown in FIG. 10-(c), the wiring layer 26 made of copper (Cu) is selectively provided so as to extend from the exposed surface of the electrode pad 23 to the upper surface of the organic insulation film 25. The wiring layer 26 made of copper (Cu) can be formed by a plating method or a film formation method and a photo process.

Next, the metal pole (post) 27 made of copper (Cu) is provided in the vicinity of the end part of the wiring layer 26 by, for example, a selective plating method. A covering layer (not shown) is provided on a surface of the metal pole 27. The covering layer is made of, from the surface of the metal pole 27, Nickel (Ni)/gold (Au) or Nickel (Ni)/palladium (Pd)/gold (Au). See FIG. 10-(d).

Next, an exposed surface of the multilayer interconnection layer 22 where the organic insulation film 25 is not provided, the exposed surface of the organic insulation film 25, the exposed surface of the wiring layer 26, and the side surface of the metal pole 27 are covered with the sealing resin 28. The sealing resin 28 has a height (thickness) so that the upper surface of the sealing resin 28 reaches a position slightly lower than the upper surface of the metal pole 27. See FIG. 12-(e).

As the sealing resin 28, polyimide, benzocyclobutene, polybenzoxazole, phenol resin, bismaleimide-triazine resin, and epoxy resin can be used.

In addition, a so-called transfer molding method can be used as a method for performing the covering with the sealing resin 28. In addition, a so-called compression molding method can be applied.

Then, outside connection projection electrodes 29 having substantially spherical shapes are provided on upper end parts of plural metal poles 27 slightly projecting from the upper surface of the sealing resin 28. The outside connection projection electrode 29 is made of, for example, tin (Sn)—silver (Ag) solder or tin (Sn)—silver (Ag) solder including copper (Cu). The outside connection projection electrode 29 is attached by a solder dipping method and a substantially spherical-shaped projection electrode can be formed by heating.

After that, a dicing process using a dicing blade 10 is applied so that the semiconductor substrate 21 together with the sealing resin 28 and the multilayer interconnection layer 22 provided on the surface of the semiconductor substrate 21 are diced so that the individual semiconductor device 100 shown in FIG. 4 is formed. See FIG. 12-(f).

Even if a crack or damage is generated in the multilayer interconnection layer 22 at the time of dicing the multilayer interconnection layer 22, the crack is prevented from being extended by the organic insulation films 25 provided in the groove forming part 30 of the multilayer interconnection layer 22 and on the surface of multilayer interconnection layer 22. As a result of this, the wiring region forming the electronic circuit of the multilayer interconnection layer 22 can be effectively protected.

Furthermore, the organic insulation film 25 is made of a material softer than the sealing resin 28. Hence, it is possible to effectively absorb or ease thermal stress or mechanical stress from the outside under an environment of use or in an environmental test of the semiconductor device 100. Thus, it is possible to improve reliability of the semiconductor device 100.

In addition, the groove forming part 30 is formed in the multilayer interconnection layer 22 and the groove forming part 30 is filled with the organic insulation material forming the organic insulation film 25. Hence, the organic insulation film 25 comes in contact with the multilayer interconnection layer 22 with a large contact area.

As a result of this, even if moisture enters from an interface of the multilayer interconnection layer 22 and the sealing resin 28, the moisture enters along an internal wall of the groove forming part 30. The length of the path as shown by a dotted arrow in FIG. 4, namely the length of the path along the internal surface, is long. Therefore, moisture entering the functional element of the semiconductor device is effectively prevented. Thus, it is possible to improve reliability of the semiconductor device 100.

Figure 13:
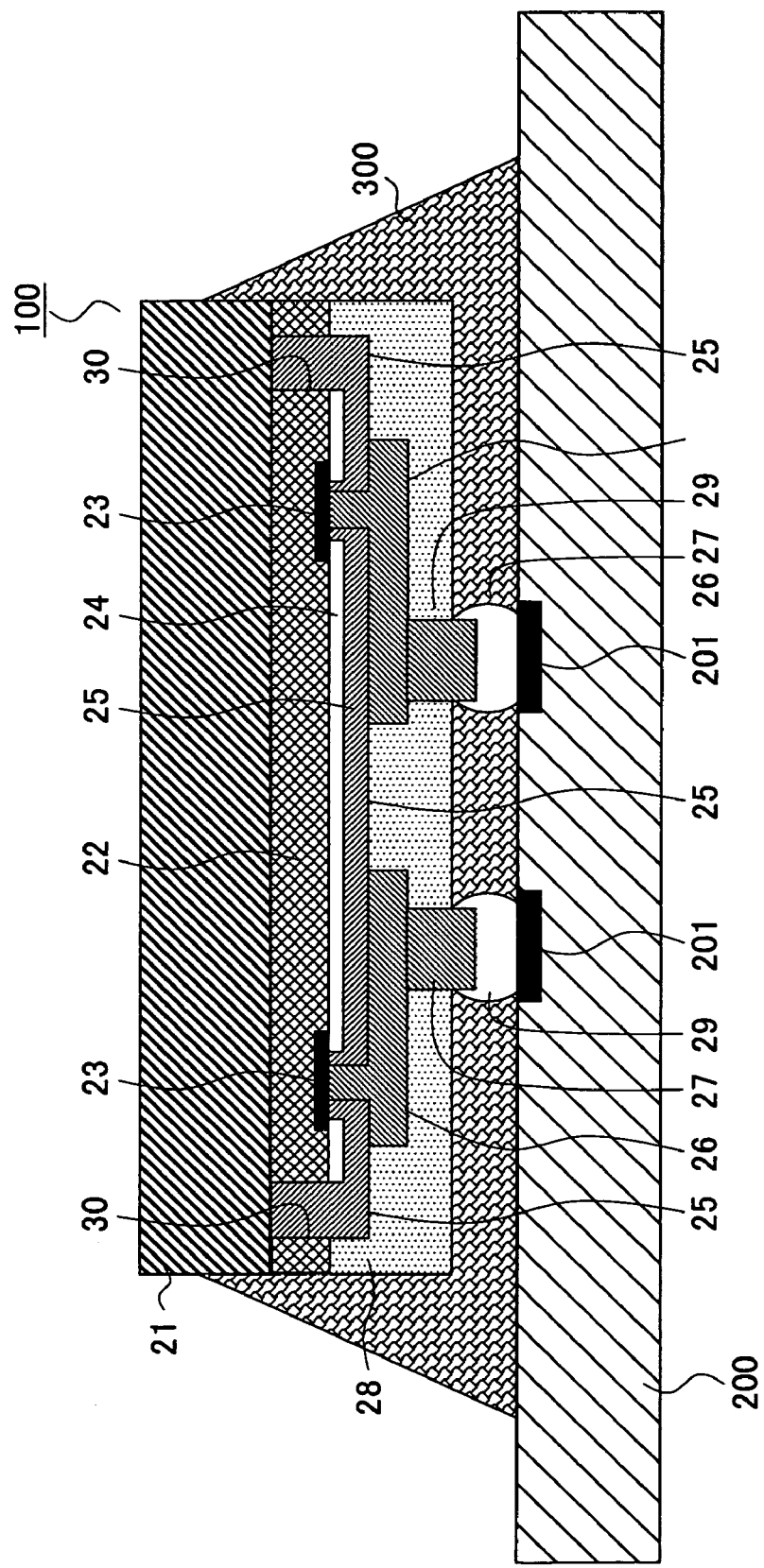
FIG. 13 is a cross-sectional view showing an example where the semiconductor device shown in FIG. 4 is mounted on a wiring board.

FIG. 13 is a cross-sectional view showing an example where the semiconductor device 100 shown in FIG. 4 is mounted on a mounting board such as a printed wiring board.

The semiconductor device 100 is mounted on a mounting substrate 200 by a flip chip (face down) method. Therefore, the outside connection projection electrode 29 of the semiconductor device 100 is connected to the electrode pad 201 provided on the mounting substrate 200. So-called underfill member 300 fills in between the semiconductor device 100 and the mounting substrate 200.

At this time, the underfill member 300 is provided not only between the semiconductor device 100 and the mounting substrate 200 but also comes in contact with a part of the side surface of the semiconductor substrate 21. Because of this structure, it is possible to reduce or prevent stress being applied to the multilayer interconnection layer 22 via the sealing resin 28.

In manufacturing of the semiconductor device 110 shown in FIG. 7, in the step shown in FIG. 10-(d), after the wiring layer 26 is provided so as to extend from the upper surface of the electrode pad 23 to the organic insulation film 25, the sealing resin 28 covers the exposed surface of the multilayer interconnection layer 22, the exposed surface of the organic insulation film 25, and the exposed surface of the wiring layer 26.

After that, a selective ashing process such as a plasma process is applied via the mask to the sealing resin 28 so that an opening is formed in a position of the wiring layer 26 where the projection electrode 29 is provided.

Then, the opening is filled with a solder material. A base part 29a of the projection electrode 29 is embedded in the opening and a spherical shaped head part 29b extending from the base part 29a is positioned on an upper surface of the sealing resin 28 so that the projection electrode 29 is completed.

After that, the dicing process is applied so that the semiconductor device 110 is completed.

Furthermore, in manufacturing the semiconductor device 120 shown in FIG. 8, in step shown in FIG. 10-(d), the sealing resin 28 is provided so as to be situated at the same height as the upper end surface of the metal pole 27.

Then, a dicing process is applied so that the semiconductor device 120 is completed.

Figure 14:
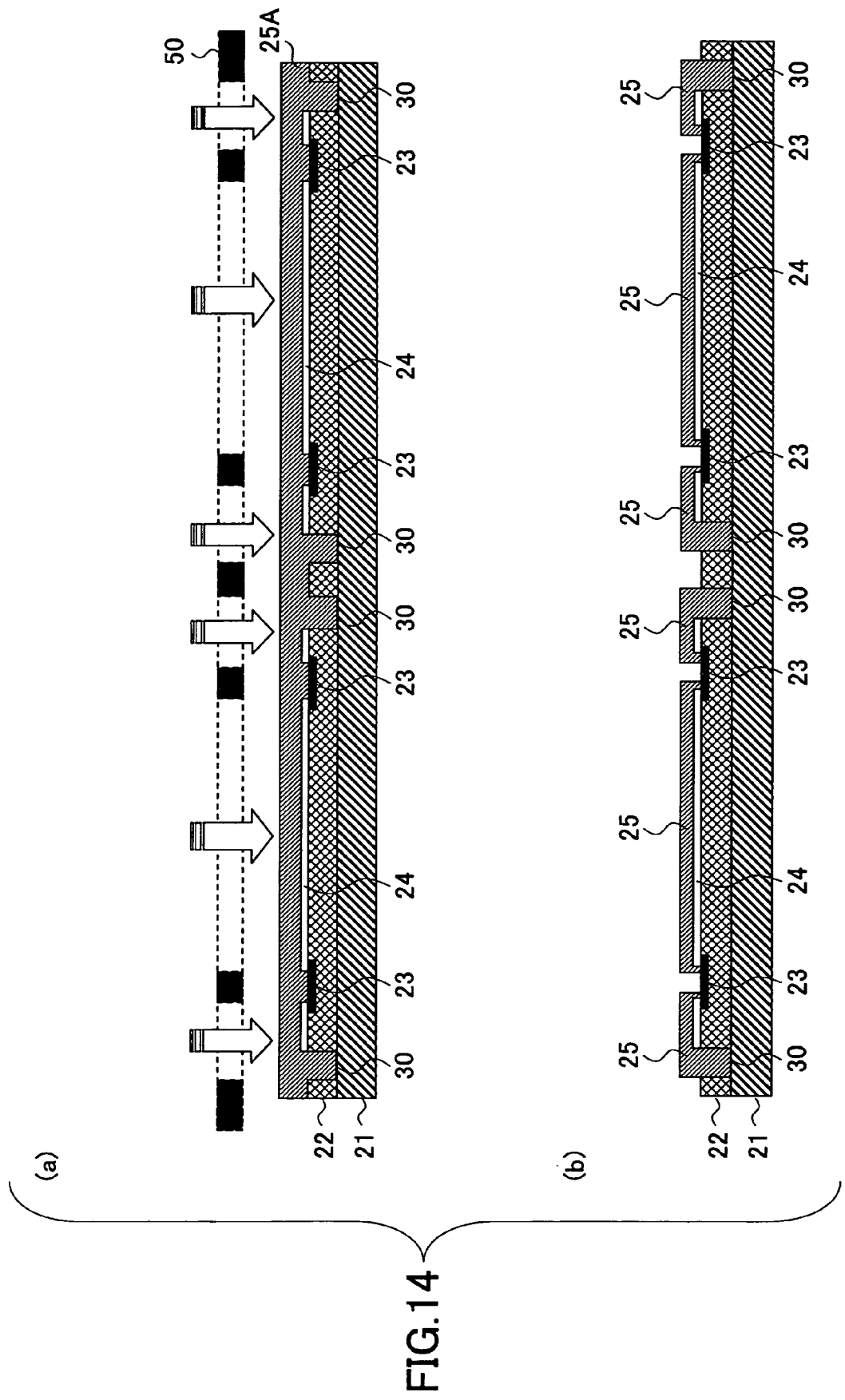
FIG. 14 is a cross-sectional view showing a first example of a step wherein a material forming an organic insulation film is supplied on a semiconductor substrate.
Figure 15:
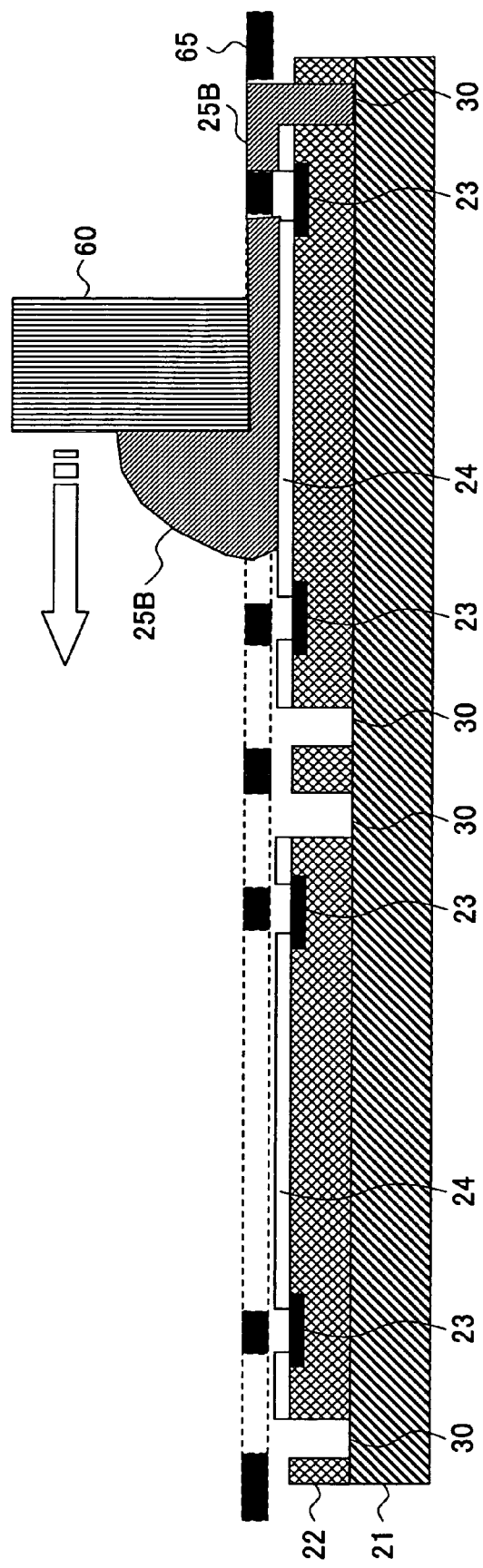
FIG. 15 is a cross-sectional view showing a second example of the step wherein the material forming the organic insulation film is supplied on the semiconductor substrate.

Here, with reference to FIG. 14 and FIG. 15, a process forming the organic insulation film 25 by covering the semiconductor substrate 21 with the organic insulation material is discussed;

In the example shown in FIG. 14, photosensitive polyimide is used as the organic insulation material forming the organic insulation film 25.

Photosensitive polyimide 25A is applied on the multilayer interconnection layer 22, the inorganic insulation layer 24, the electrode pad 23, and the groove forming part 30. Then, an ultraviolet light or the like is selectively irradiated on the photosensitive polyimide 25A via the mask 50.

The mask 50 has openings situated at regions other than regions corresponding to end parts of semiconductor chips which will be made into single chips in a later step and corresponding to the substantial centers of the electrode pads 23.

The ultraviolet light is selectively irradiated on the photosensitive polyimide 25A via the openings of the mask 50. See FIG. 14-(a).

After that, a developing process is applied to the photosensitive polyimide 25A so that photosensitive polyimide situated at parts where the ultraviolet light has not been irradiated, namely regions corresponding to end parts of the semiconductor chips which will be made into single chips in a later step and corresponding to the substantial centers of the electrode pads 23, is removed. See FIG. 14-(b).

In a case where non-photosensitive polyimide is used as the organic insulation material forming the organic insulation film 25, the non-photosensitive polyimide is patterned by a selective etching method using a photo resist layer.

In other words, a positive or negative type photo resist layer is formed on the non-photosensitive polyimide layer covering the multilayer interconnection layer 22 provided on the semiconductor substrate, the inorganic insulation layer 24, the electrode pad 23, and the groove forming part 30. The ultraviolet light is irradiated to the photo resist layer via the mask.

By using the pattern obtained by developing the photo resist layer as a mask, the non-photosensitive polyimide layer is selectively etched so that a desirable pattern is obtained. After that the photo resist layer is removed.

In a case where a liquid state material is used as the organic insulation material forming the organic insulation film 25, a printing method can be applied.

In other words, a mask 65 is provided so as to cover the multilayer interconnection layer 22 provided on the semiconductor substrate, the inorganic insulation layer 24, the electrode pad 23, and the groove forming part 30, and a liquid state organic insulation material 25B is printed (applied) by using a squeegee 60. See FIG. 15. The mask 65 is, for example, made of stainless (SUS) material.

The mask 65 has openings situated at regions other than regions corresponding to the end parts of the semiconductor chips which will be made into single chips in a later step and corresponding to the substantial centers of the electrode pads 23.

Accordingly, the liquid state organic insulation material 25B is printed (applied) to a portion corresponding to the piercing hole of the mask 65 of a film provided on the semiconductor substrate. After the printing (applying) process, the mask 65 is removed.

After the steps shown in FIG. 14 or FIG. 15, a thermal process is applied to the organic insulation material 25A or 25B for curing so that a the state shown in FIG. 10-(c) is obtained.

The present invention is not limited to these embodiments, but variations and modifications may be made without departing from the scope of the present invention.

This patent application is based on Japanese Priority Patent Application No. 2006-161128 filed on Jun. 9, 2006, the entire contents of which are hereby incorporated by reference.

What is claimed is:

1. A semiconductor device, comprising:
a semiconductor substrate in which a plurality of functional elements are formed;
a multilayer interconnection layer provided over the semiconductor substrate, the multilayer interconnection layer including a plurality of wiring layers mutually connecting the plural functional elements and including a plurality of interlayer insulation layers, the multilayer interconnection layer having a structure in which the plural wiring layers and the plural interlayer insulation layers are stacked on each other; and
a plurality groove forming parts provided in the multilayer interconnection layer outside a wiring region where the plural wiring layers are formed and connected to electrode pads, each of the groove forming parts positioned inside a dicing line provided along a circumference of each functional element, and each of the groove forming parts piercing the plural interlayer insulation layers in the multilayer interconnection layer to reach an upper surface of the semiconductor substrate,
wherein each of the groove forming parts is filled with an organic insulation material and the organic insulation material is provided to cover an upper surface of the multilayer interconnection layer,
wherein the plurality of groove forming parts is formed in the multilayer interconnection layer so as to surround the region where the wiring layer is formed.

2. The semiconductor device, as claimed in claim 1, wherein the groove has width equal to or greater than approximately 2 μm and equal to or smaller than approximately 50 μm.

3. The semiconductor device, as claimed in claim 1, wherein a piercing length of the groove in the multilayer interconnection layer is equal to or greater than approximately 0.1 μm.

4. The semiconductor device, as claimed in claim 1, wherein the organic insulation material is selected from a group consisting of polyimide, benzocyclobutene, phenol resin, and polybenzoxazole.

5. The semiconductor device as claimed in claim 1, wherein an outside connection projection electrode is formed on one end of the metal pole, the one end being exposed from the resin.

6. The semiconductor device as claimed in claim 1, further comprising:
a first insulation layer opening a plurality of electrode pads formed on the multilayer interconnection layer, the first insulation layer being provided over the multilayer interconnection layer;
a second wiring layer connected to the electrode pads and provided over the first insulation layer;
a metal pole provided on the second wiring layer; and
resin formed over the first insulation layer and the second wiring layer and exposing one end of the metal pole.

7. The semiconductor device, as claimed in claim 6, wherein the resin is selected from a group consisting of polyimide, benzocyclobutene, polybenzoxazole, phenol resin, bismaleimide-triazine resin, and epoxy resin.

\* \* \* \* \*